(12) United States Patent
Stark

(10) Patent No.: US 11,031,511 B2
(45) Date of Patent: Jun. 8, 2021

(54) CONTROL CIRCUIT AND METHOD OF OPERATING A CONTROL CIRCUIT

(71) Applicant: STMicroelectronics (Research & Development) Limited, Marlow (GB)

(72) Inventor: Laurence Stark, Edinburgh (GB)

(73) Assignee: STMicroelectronics (Research & Development) Limited, Marlow (GB)

( * ) Notice: Subject to any disclaimer, the term of this patent is extended or adjusted under 35 U.S.C. 154(b) by 330 days.

(21) Appl. No.: 16/157,882

(22) Filed: Oct. 11, 2018

(65) Prior Publication Data

US 2019/0123215 A1 Apr. 25, 2019

(30) Foreign Application Priority Data

Oct. 25, 2017 (EP) .................................. 17198338

(51) Int. Cl.
*H01L 31/00* (2006.01)
*H01L 31/02* (2006.01)
*G01J 1/44* (2006.01)
*H01L 31/107* (2006.01)

(52) U.S. Cl.
CPC .......... *H01L 31/02027* (2013.01); *G01J 1/44* (2013.01); *H01L 31/107* (2013.01); *G01J 2001/4466* (2013.01)

(58) Field of Classification Search
CPC .... H01L 31/02027; H01L 31/107; G01J 1/44; G01J 2001/4466
See application file for complete search history.

(56) References Cited

U.S. PATENT DOCUMENTS

| 9,178,100 | B2 | 11/2015 | Webster et al. |
| 10,217,889 | B2* | 2/2019 | Dhulla ............... H01L 27/1446 |
| 10,243,356 | B2 | 3/2019 | Heurtier et al. |
| 2003/0030951 | A1 | 2/2003 | Green |
| 2008/0068584 | A1* | 3/2008 | Mori ..................... G01S 7/4865 356/5.01 |
| 2013/0334411 | A1 | 12/2013 | Brunel et al. |
| 2017/0131143 | A1 | 5/2017 | Andreou et al. |

FOREIGN PATENT DOCUMENTS

| CN | 102538988 A | 7/2012 |
| CN | 103299437 A | 9/2013 |
| CN | 203225769 U | 10/2013 |
| CN | 103487148 A | 1/2014 |
| CN | 105990825 A | 10/2016 |
| CN | 107063452 A | 8/2017 |

OTHER PUBLICATIONS

Extended European Search Report, dated May 9, 2018, for European Application No. 17198338.0-1230, 7 pages.

* cited by examiner

*Primary Examiner* — Kevin K Pyo
(74) *Attorney, Agent, or Firm* — Seed IP Law Group LLP

(57) ABSTRACT

Various embodiments provide a control circuit that includes at least one active module designed to enable an avalanche diode. The control circuit also includes at least one passive module designed to disable the avalanche diode.

24 Claims, 10 Drawing Sheets

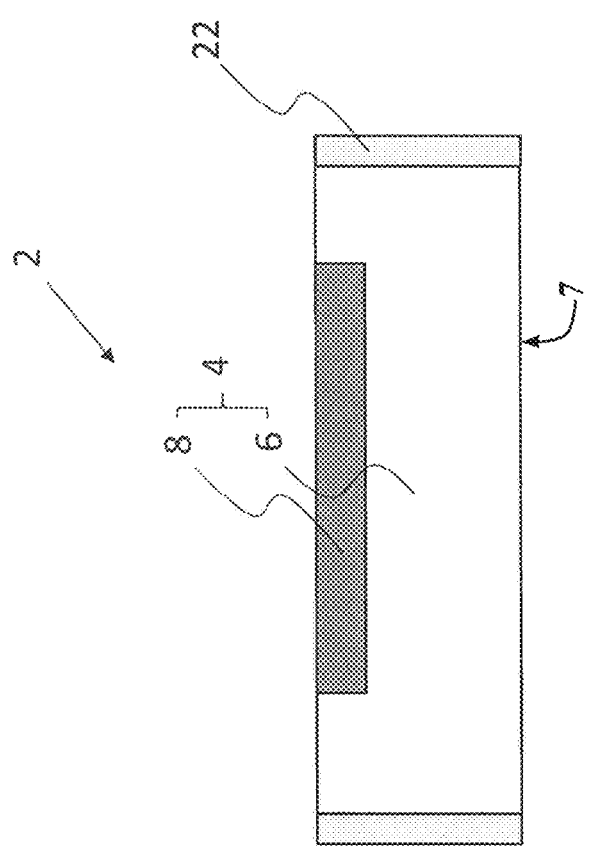

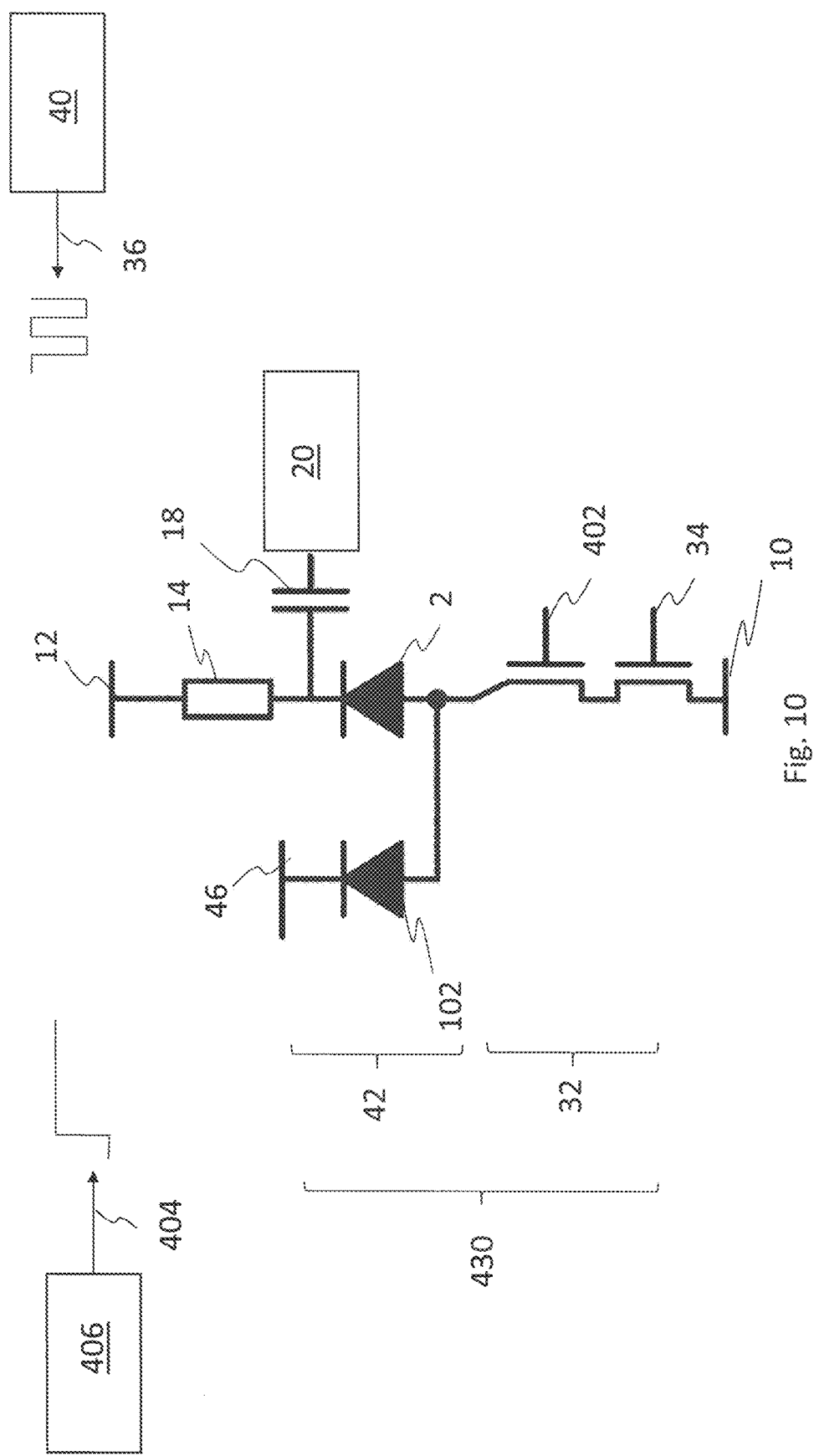

CONTROL CIRCUIT AND METHOD OF OPERATING A CONTROL CIRCUIT

BACKGROUND

Technical Field

The present disclosure relates to a control circuit, in particular a control circuit for controlling an avalanche diode, and a method of operating the control circuit.

Description of the Related Art

Existing single photon avalanche diodes (SPADs) are based on a PN junction. The PN junction is reverse biased at a voltage exceeding a breakdown voltage. In this way, a carrier generated by a single photon can be injected into a depletion region and can cause a self-sustaining avalanche. The SPAD may be quenched allowing the PN junction to be reset to detect further photons.

BRIEF SUMMARY

According to one aspect, there is provided a control circuit, comprising: at least one active module designed to enable an avalanche diode; and at least one passive module designed to disable the avalanche diode The at least one active module may be designed to set a reverse bias voltage above or at a breakdown voltage.

The at least one passive module may designed to set the reverse bias voltage below the breakdown voltage The at least one passive module may include at least one clamp diode arranged to connect a supply voltage to an electrode of the avalanche terminal.

The at least one clamp diode may include a cathode connected to the supply voltage and an anode connected to an anode of the avalanche diode.

The at least one active module may include at least one first switch controlled by at least one first control signal to connect and disconnect an electrode of the avalanche diode to a voltage supply.

The at least one first switch may be a metal-oxide-semiconductor, MOS, switch.

The at least one first switch may be an N type metal-oxide-semiconductor, NMOS, switch.

The at least one first switch may be an N type extended drain metal-oxide-semiconductor, NEDMOS, switch.

The at least one active module may include at least one second switch controlled by at least one second control signal to connect and disconnect an electrode of the avalanche diode to the voltage supply.

The at least one second switch may be a metal-oxide-semiconductor, MOS, switch.

The at least one second switch may be an N type metal-oxide-semiconductor, NMOS, switch.

The at least one second switch may be an N type extended drain metal-oxide-semiconductor, NEDMOS, switch.

The at least one first switch and the at least one second switch may be connected in a cascode arrangement.

A drain of the at least one first switch may be connected to the source of the at least one second switch.

A source of the at least one first switch is connected to the voltage supply.

A drain of the at least one second switch may be connected to the anode of the avalanche diode.

A gate of the at least one first switch may be arranged to receive the first control signal.

A gate of the at least one second switch may be arranged to receive the second control signal.

The avalanche diode may be an avalanche photodiode.

The avalanche diode may be a single photo avalanche diode (SPAD),

According to a second aspect there is provided a system, comprising: an avalanche diode; and a control circuit comprising: at least one active module designed to enable an avalanche diode; and at least one passive module designed to disable the avalanche diode The at least one active module may be designed to set a reverse bias voltage above or at a breakdown voltage.

The at least one passive module may designed to set the reverse bias voltage below the breakdown voltage The at least one passive module may include at least one clamp diode arranged to connect a supply voltage to an electrode of the avalanche terminal.

The at least one clamp diode may include a cathode connected to the supply voltage and an anode connected to an anode of the avalanche diode.

The at least one active module may include at least one first switch controlled by at least one first control signal to connect and disconnect an electrode of the avalanche diode to a voltage supply.

The at least one first switch may be a metal-oxide-semiconductor, MOS, switch.

The at least one first switch may be an N type metal-oxide-semiconductor, NMOS, switch.

The at least one first switch may be an N type extended drain metal-oxide-semiconductor, NEDMOS, switch.

The at least one active module may include at least one second switch controlled by at least one second control signal to connect and disconnect an electrode of the avalanche diode to the voltage supply.

The at least one second switch may be a metal-oxide-semiconductor, MOS, switch.

The at least one second switch may be an N type metal-oxide-semiconductor, NMOS, switch.

The at least one second switch may be an N type extended drain metal-oxide-semiconductor, NEDMOS, switch.

The at least one first switch and the at least one second switch may be connected in a cascode arrangement.

A drain of the at least one first switch may be connected to the source of the at least one second switch.

A source of the at least one first switch is connected to the voltage supply.

A drain of the at least one second switch may be connected to the anode of the avalanche diode.

A gate of the at least one first switch may be arranged to receive the first control signal.

A gate of the at least one second switch may be arranged to receive the second control signal.

The avalanche diode may be an avalanche photodiode.

The avalanche diode may be a single photo avalanche diode (SPAD),

The system may be an imaging sensor.

According to a third aspect, there is provided a method of operating a control circuit comprising: operating at least one active module designed to enable an avalanche diode; and operating at least one passive module designed to disable the avalanche diode.

The at least one active module may be designed to set a reverse bias voltage above or at a breakdown voltage.

The at least one passive module may designed to set the reverse bias voltage below the breakdown voltage The at least one passive module may include at least one clamp diode arranged to connect a supply voltage to an electrode of the avalanche terminal.

The at least one clamp diode may include a cathode connected to the supply voltage and an anode connected to an anode of the avalanche diode.

The at least one active module may include at least one first switch controlled by at least one first control signal to connect and disconnect an electrode of the avalanche diode to a voltage supply.

The at least one first switch may be a metal-oxide-semiconductor, MOS, switch.

The at least one first switch may be an N type metal-oxide-semiconductor, NMOS, switch.

The at least one first switch may be an N type extended drain metal-oxide-semiconductor, NEDMOS, switch.

The at least one active module may include at least one second switch controlled by at least one second control signal to connect and disconnect an electrode of the avalanche diode to the voltage supply.

The at least one second switch may be a metal-oxide-semiconductor, MOS, switch.

The at least one second switch may be an N type metal-oxide-semiconductor, NMOS, switch.

The at least one second switch may be an N type extended drain metal-oxide-semiconductor, NEDMOS, switch.

The at least one first switch and the at least one second switch may be connected in a cascode arrangement.

A drain of the at least one first switch may be connected to the source of the at least one second switch.

A source of the at least one first switch is connected to the voltage supply.

A drain of the at least one second switch may be connected to the anode of the avalanche diode.

A gate of the at least one first switch may be arranged to receive the first control signal.

A gate of the at least one second switch may be arranged to receive the second control signal.

The avalanche diode may be an avalanche photodiode.

The avalanche diode may be a single photo avalanche diode (SPAD),

BRIEF DESCRIPTION OF THE SEVERAL VIEWS OF THE DRAWINGS

Reference will now be made, by way of example, to the accompanying drawings in which:

FIG. 1 shows a cross-section of an avalanche diode;

FIG. 10 shows a control circuit for controlling the avalanche diode of FIG. 1 according to a fourth embodiment.

DETAILED DESCRIPTION

Figure 2A:
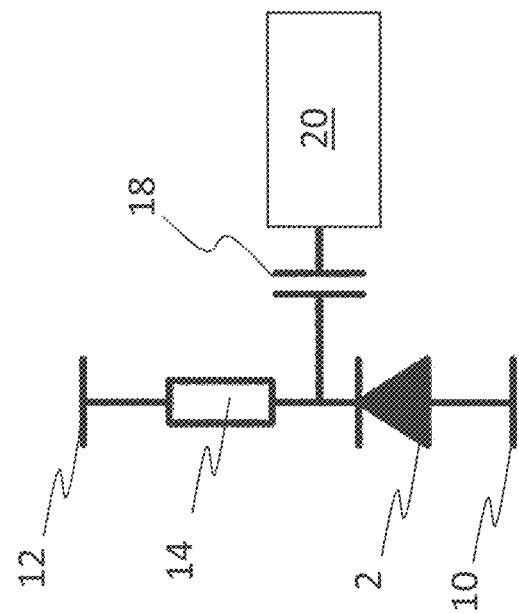
FIG. 2a shows the avalanche diode of FIG. 1 when reverse biased with an anode moving node.

A diode is an electrical device allowing current to move through it in one direction with far greater ease than in the other. The most common kind of diode in modern circuit design is the semiconductor diode and is based on a PN junction.

A PN junction includes a P region (i.e., region doped with a P dopant) and an N region (i.e., region doped with an N dopant type). The N region contains electrons in excess while the P region contains holes in excess. When the PN junction is formed holes are naturally diffused from the P region to the N region and recombined with electrons. Likewise, electrons are naturally diffused from the N region to the P region and are recombined with holes. In this way, a depletion region with pairs of recombined holes and electrons is formed at the interface (i.e., the junction) of the P region and the N region. Stated differently, the depletion region is formed where the P region and the N region meet each other.

The diffusion of holes from the P region leaves negative acceptor ions in the P region while the diffusion of electrons from the N region leaves positive donor ions in the N region. This creates a depletion region electric field that provides a force opposing the continued diffusion of holes and electrons. When the depletion region electric field is sufficiently high the diffusion of holes and electrons is interrupted and the depletion region reaches equilibrium.

The width or size of the depletion region depends on the concentration of holes in the P region, the concentration of electrons in the N region and a voltage supply applied to the PN junction.

When the voltage supply is a forward bias voltage supply, the P region is connected to a positive terminal of the voltage supply and the N region is connected to a negative terminal of the voltage supply. In this way, the holes in the P region and the electrons in the N region are pushed toward the interface of the P region and the N region. As a result, the width or size of the depletion region decreases.

When the voltage supply is a reverse bias voltage supply, the P region is connected to a negative terminal of the voltage supply and the N region is connected to a positive terminal of the voltage supply. In this way, the holes in the P region and the electrons in the N region are pushed away from the interface of the P region and the N region. The width of the depletion region increases.

The width or size of the depletion region increases with the increase in reverse bias voltage supply up to a certain voltage. If the reverse bias voltage supply is increased beyond that voltage, the junction breaks down and allows a reverse current. At this point, a small increase in the voltage will rapidly increase the reverse current. The voltage at which the PN junction breaks down occurs is known as the "breakdown voltage".

The depletion region breakdown may be caused by two mechanisms: Zener breakdown and avalanche breakdown.

In avalanche breakdown, when the reverse voltage supply exceeds the breakdown voltage, electrons generated or introduced in the depletion region are accelerated. The electrons collide with atoms and free bound electrons. Some of these electrons recombine with holes. Others are accelerated in the depletion region, collide with atoms and free further bound electrons, and so on. Likewise, holes diffused in the depletion region area are accelerated in the opposite direction and initiate a similar process. In this way, a self-sustaining avalanche is created and the reverse current increases.

An avalanche diode, such as a single photon avalanche detector (SPAD), follows the above principle. The PN junction is reverse biased at a voltage exceeding the breakdown voltage. When a photon with sufficient energy is absorbed, a bound electron is freed in the depletion region. The electron is accelerated, collides with atoms and frees further bound electrons. Some of these electrons recombine with holes. Others are accelerated, collide with atoms and free further bound electron, and so on. Likewise, holes diffused in the depletion region area are accelerated in the opposite direction and initiate a similar process. In this way, a self-sustaining avalanche is created and the reverse current increases. It is noted that an electron generated outside of the depletion region can also trigger an avalanche if it subsequently diffuses (or drifts) into the depletion region. The avalanche can be stopped by setting the reverse bias voltage supply below the breakdown voltage.

FIG. 1 represents an avalanche diode 2, for example a single photon avalanche diode (SPAD). As will be discussed in further detail below, the avalanche diode 2 may be implemented as part of a back side illuminated light detector. The avalanche diode 2 may typically be integrated in a system, such as an imaging sensor.

The avalanche diode 2 comprises a PN junction 4 including a P region 6 (i.e., a region or layer doped with a P dopant to have a P-type conductivity) and an N region 8 (i.e., a region or layer doped with an N dopant to have an N-type conductivity). In one embodiment, the P region 6 is an epitaxial layer of P dopant type grown on a Silicon substrate (not shown in FIG. 1), and the N region 8 is a well of N dopant type formed within the epitaxial layer. In one embodiment, as shown in FIG. 1, the N region 8 is centered (i.e., aligned with a central longitudinal (vertical) axis of the avalanche diode 2). The PN junction 4 also comprises a depletion region (also known as depletion layer or depletion zone) that is naturally formed at the interface (i.e., junction) of the P region 6 and the N region 8 as described above.

The avalanche diode 2 comprises an anode (not shown in FIG. 1) connecting the P region 6 to a negative terminal of a voltage supply 10 and a cathode (not shown in FIG. 1) connecting the N region 8 to a positive terminal of the voltage supply 12.

The avalanche diode 2 advantageously comprises a trench isolation region 22 surrounding the PN junction 4 to prevent current leakage from/toward adjacent semiconductor device components. The trench isolation region 22 is, for example, made of Silicon Dioxide ($SiO_2$).

In one embodiment, the avalanche diode 2 shown in FIG. 1 is a back side illuminated avalanche diode. That is, the avalanche diode 2 may be part of an illuminated light detector that is positioned in front of various metal layers and/or electrical components (e.g., resistors, capacitors, processors, etc.) that may be coupled to the illuminated light detector. By positioning the illuminated light detector in front, the various metal layers and/or electrical components will not block any received light from reaching the illuminated light detector. As a result, the amount of light captured can be increased and low-light performance can be improved. As discussed above, when a photon with sufficient energy is absorbed via the back side (i.e., a side 7 of the avalanche diode 2), a bound electron is freed in the depletion region, accelerated, collides with atoms and free further bound electrons. Some of these electrons recombine with holes. Others are accelerated in, collide with atoms and free further bound electrons, and so on.

FIG. 2a shows the avalanche diode 2 of FIG. 1 when reverse biased with an anode moving node. The cathode of the avalanche diode 2 is directly connected to the supply voltage 12. The anode of the avalanche diode 2 is indirectly connected to the supply voltage 10 via a resistor 14. Furthermore, the anode of the avalanche diode 2 is indirectly connected to a detection module 20 via a capacitor 18. In one embodiment, the detection module 20 includes a comparator (not shown in FIG. 2a) arranged to output a determined value (e.g., pulse or no pulse) when the reverse current flowing through the diode 2 is above a threshold. A comparator can, for example, be implemented by cascading two complementary metal-oxide-semiconductor (CMOS) inverters.

Figure 2B:
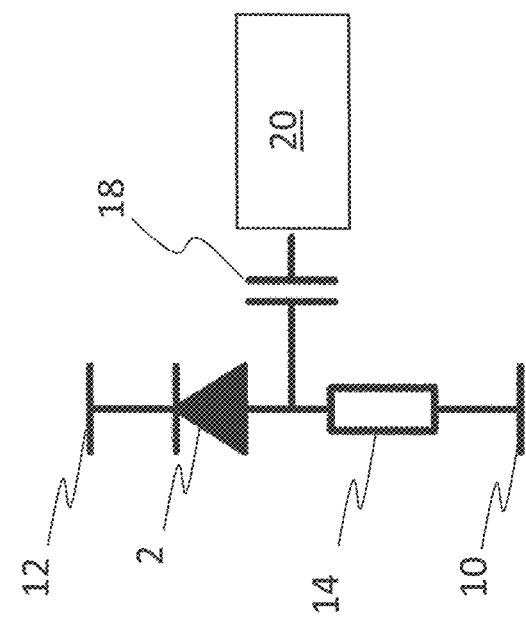
FIG. 2b shows the avalanche diode of FIG. 1 when reverse biased with a cathode moving node.

FIG. 2b shows the avalanche diode 2 of FIG. 1 when reverse biased with a cathode moving node. The anode of the avalanche diode 2 is directly connected to the supply voltage 10. The cathode of the avalanche diode 2 is indirectly connected to the supply voltage 12 via the resistor 14. Furthermore, the cathode of the avalanche diode 2 is indirectly connected to the detection module 20 via the capacitor 18. This configuration is safer and therefore preferred.

Indeed, in this arrangement the cathode of the avalanche diode 2 may be at a high voltage (e.g., greater than 10V). This is beyond the limits of standard MOSFETs in modern CMOS processes. Also, when the avalanche is triggered, the cathode voltage swing will be equal to the excess bias voltage. It is common for SPADs (especially depleted SPADs) to operate with large excess bias voltages in excess of the voltage range of a standard MOSFET. In this case, the coupling capacitor may be sized such that the pulse at the detection module 20 is attenuated to within the acceptable voltage range.

In the following disclosure various control circuits will be described for controlling the avalanche diode 2 of FIG. 1 when reverse biased with a cathode moving node as shown on FIG. 2b. However, it will be understood that these control circuits can equally be used for controlling the avalanche diode 2 of FIG. 1 when reverse biased with an anode moving node as shown on FIG. 2a.

Figure 3:
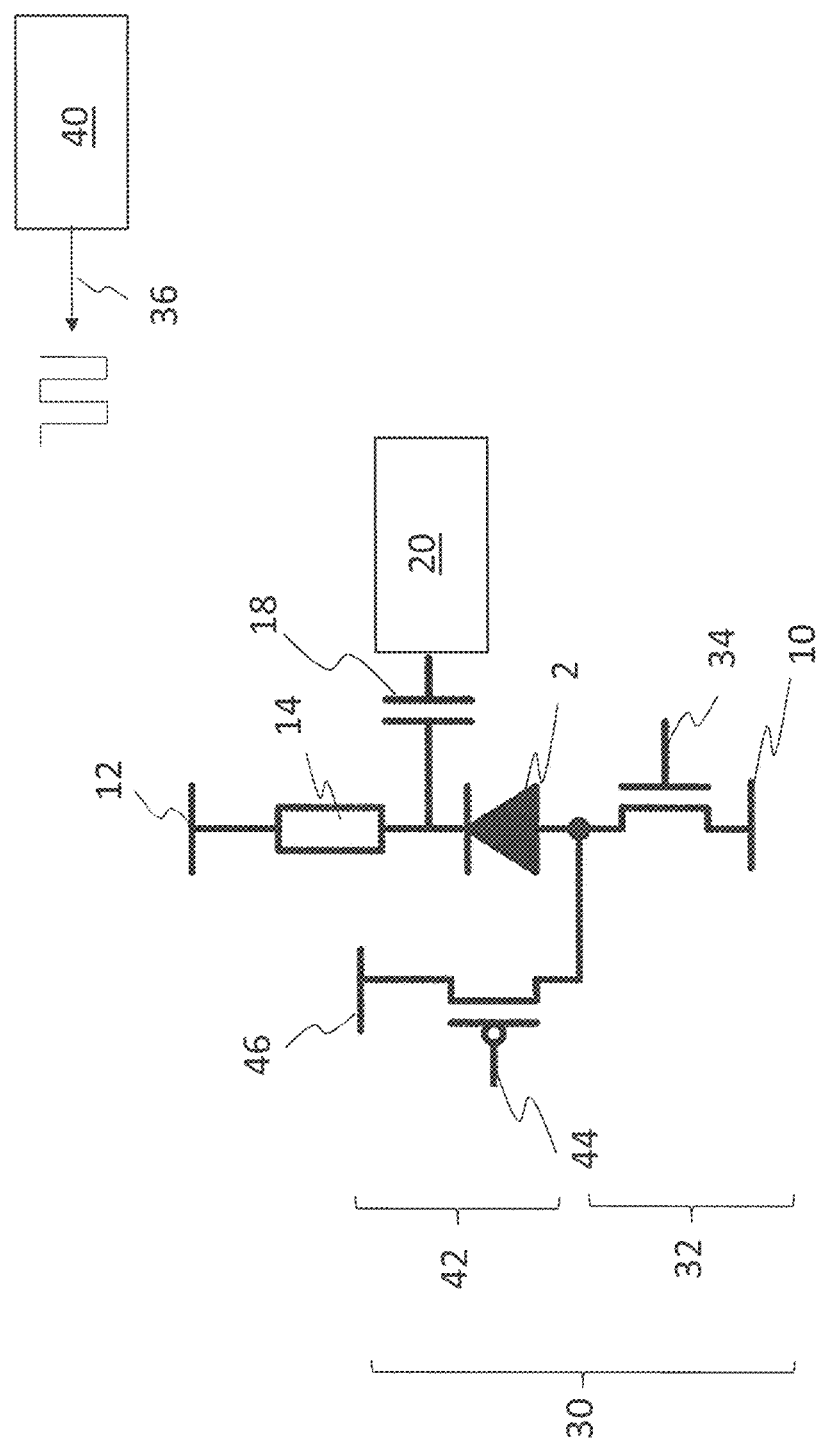
FIG. 3 shows a control circuit for controlling the avalanche diode of FIG. 1.

FIG. 3 represents a control circuit 30 for controlling the avalanche diode 2 of FIG. 1. Here, the control circuit 30 includes a CMOS device.

The control circuit 30 comprises an active pull down module 32 designed to set the reverse bias voltage above or at a breakdown voltage of the avalanche diode 2 and therefore enable the avalanche diode 2. The active pull down module 32, in other words, is configured to selectively pull down the potential of the anode of the avalanche diode 2. The active pull down module 32 includes a switch 34 controlled by a control signal 36 to connect and disconnect the anode of the avalanche diode 2 to the voltage supply 10. In one embodiment, as shown in FIG. 3, the switch 34 is formed by an N channel metal-oxide-semiconductor (NMOS) transistor. The NMOS transistor includes a drain connected to the anode of the avalanche diode 2, a source connected to voltage supply 10, and a gate connected to a control signal generator 40 providing the control signal 36. In one embodiment, the control signal 36 may be a square wave signal that alternates between a high potential and a low potential. Stated differently, the control signal 36 alternates between a first voltage level, and a second voltage level that is smaller than the first voltage level.

The control circuit 30 comprises an active pull up module 42 designed to set the reverse bias voltage below the breakdown voltage of the avalanche diode 2 and therefore disable the avalanche diode 2. The active pull up module 42, in other words, is configured to selectively pull up the potential of the anode of the avalanche diode 2. The active pull up module 42 includes a switch 44 controlled by the control signal 36 to connect and disconnect the anode of the avalanche diode 2 to a voltage supply 46. In one embodiment, as shown in FIG. 3, the switch 44 is formed by a P channel metal-oxide-semiconductor (PMOS) transistor. The PMOS transistor includes a drain connected to the anode of the avalanche diode 2, a source connected to voltage supply 46 and a gate connected to the control signal generator 40 providing the control signal 36.

Figure 4:
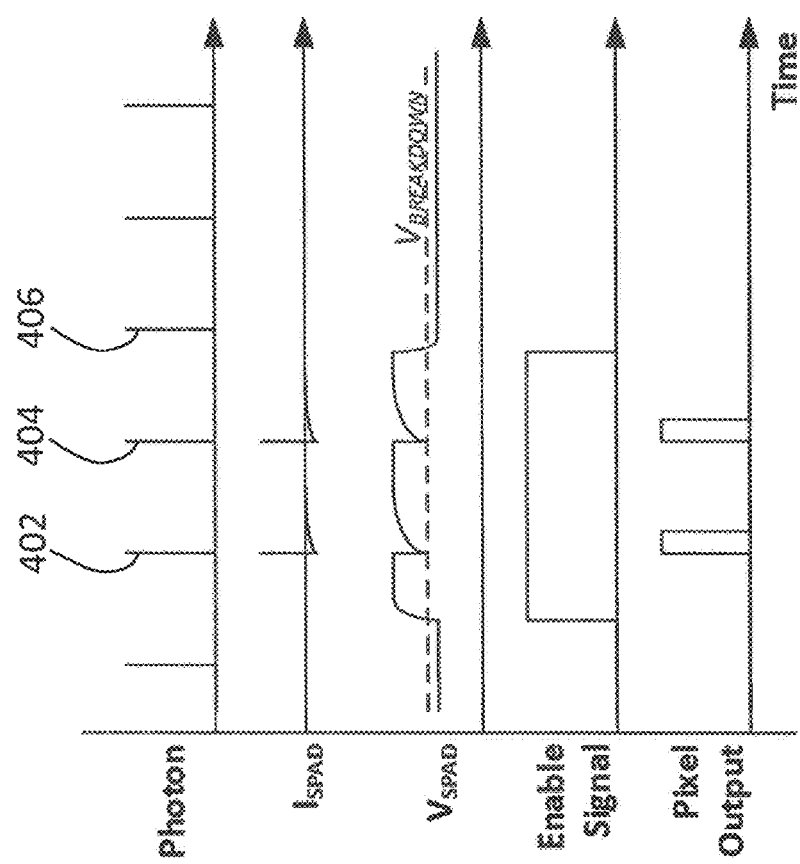
FIG. 4 shows a graph illustrating the behavior of the avalanche diode of FIG. 1 when controlled by the control circuit of FIG. 3.

FIG. 4 illustrates the behavior of the avalanche diode 2 of FIG. 1 when controlled by the control circuit 30 of FIG. 3.

When the control signal 36 (Enable Signal) switches to the high potential (i.e., high voltage level) the switch 34 connects the anode of the avalanche diode 2 to the supply voltage 10. In addition, the switch 44 disconnects the anode of the avalanche diode 2 from the supply voltage 46. In this way, the reverse bias voltage ($V_{SPAD}$) may be set above the breakdown voltage of the avalanche diode 2.

When a first photon 402 is absorbed by the avalanche diode 2 an avalanche is generated as discussed above. The reverse current ($I_{SPAD}$) flowing through the avalanche diode 2 increases sharply during the avalanche (i.e., the recombination of electrons and holes in the depletion region increases sharply). The reverse current then becomes nil when the reverse bias voltage drops below the breakdown voltage. In contrast, the recharge current flowing through the resistor 14 is approximately nil during the avalanche. The recharge current increases sharply when the reverse bias voltage drops below the breakdown voltage. The recharge current exponentially decreases until being approximately nil when the reverse bias voltage is reset above the breakdown voltage. The detector 20 detects the sharp increase in the reverse current and generates an output (Pixel Output), such as a pulse. The output with the pulse is indicative of a photon has been received by the avalanche diode 2. That is, after detecting the first photon 402, the avalanche diode 2 is reset (i.e., quenched) by the resistor 14 to detect a second photon 404.

When the second photon 404 is absorbed, another avalanche is generated. Again, the reverse current flowing through the avalanche diode 2 increases sharply during the avalanche (i.e., the recombination of electrons and holes in the depletion region increases sharply). The reverse current is then approximately nil when the reverse bias voltage drops below the breakdown voltage. By contrast, the recharge current flowing through the resistor 14 is approximately nil during the avalanche. The recharge current increases sharply when the reverse bias voltage drops below the breakdown voltage. The recharge current exponentially decreases until being approximately nil when the reverse bias voltage is reset above the breakdown voltage. The detector 20 detects the sharp increase in the reverse current and generates a corresponding output (e.g., a pulse). That is, after detecting the second photon 404 the avalanche diode 2 is reset (i.e., quenched) by the resistor 14 to detect a third photon 406.

When the control signal 36 switches to the low potential (i.e., low voltage level), the switch 34 disconnects the anode of the avalanche diode 2 from the supply voltage 10. In addition, the switch 44 connects the anode of the avalanche diode 2 to the supply voltage 46. In this way, the reverse bias voltage is pulled below the breakdown voltage by the voltage supply 46.

When the third photon 406 is absorbed by the avalanche diode 2 no avalanche is generated because the reverse bias voltage is below the breakdown voltage. The reverse current flowing through the avalanche diode 2 is approximately nil. The recharge current flowing through the resistor 14 is approximately nil. The detector 20 does not detect any sharp increase in the reverse current and generates a corresponding output (e.g., no pulse).

Figure 5:
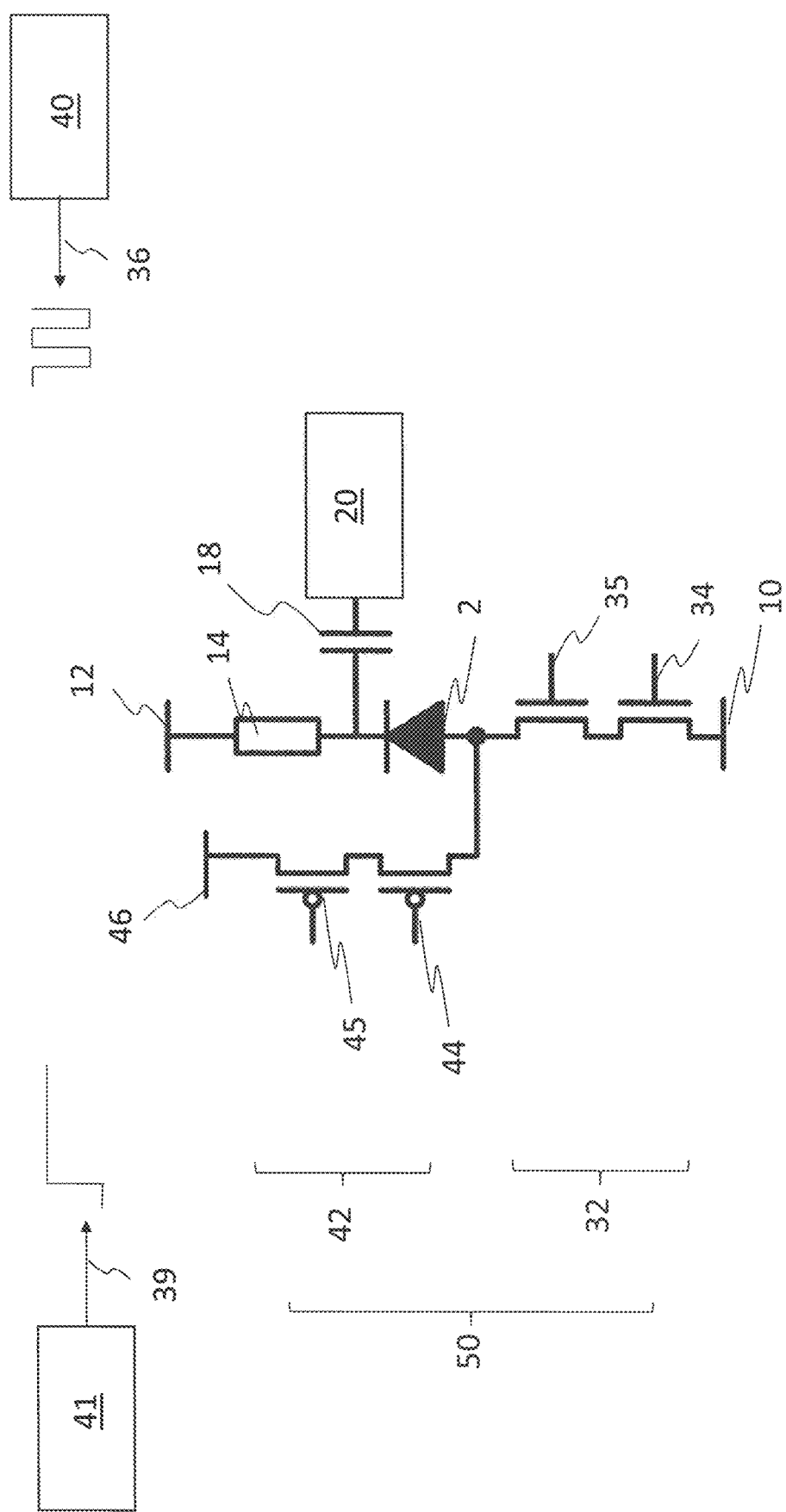
FIG. 5 shows another control circuit for controlling the avalanche diode of FIG. 1.

FIG. 5 represents a control circuit 50 for controlling the avalanche diode 2 of FIG. 1. The control circuit 50 is similar to the control circuit 30 of FIG. 3 except that the active pull down module 32 and the active pull up module 42 include cascade arrangements.

The active pull down module 32 includes the NMOS transistor 34 and an NMOS transistor 35. More specifically, the drain of the NMOS transistor 34 is connected to the source of the NMOS transistor 35. The source of the MOS transistor 34 is connected to the voltage supply 10. The drain of the NMOS transistor 35 is connected to the anode of the avalanche diode 2. The gate of the NMOS transistor 34 is arranged to receive the control signal 36. The gate of the NMOS transistor 35 is arranged to receive a control signal 39 generated by a control signal generator 41. In one embodiment, as shown in FIG. 5, the control signal 39 is fixed (i.e., not alternating). Stated differently, the control signal 39 is constant. In this way, the NMOS transistor 35 protects the NMOS transistor 34 from a potentially too high drain source voltage and becoming damaged.

Likewise, the active pull up module 42 includes the PMOS transistor 44 and a PMOS transistor 45. More specifically, the drain of the PMOS transistor 45 is connected to the source of the PMOS transistor 44. The source of the MOS transistor 45 is connected to the voltage supply 12. The drain of the PMOS transistor 44 is connected to the anode of the avalanche diode 2. The gate of the PMOS transistor 44 is arranged to receive the control signal 39. As previously discussed, the control signal 39 is fixed (i.e., constant) and will limit the voltage swing at the drain/source node between the PMOS transistor 44 and the PMOS transistor 45. The gate of the PMOS transistor 45 is arranged to receive the control signal 36. The control signal 36 is used to enable or disable the avalanche operation. In this way, the PMOS transistor 44, with its gate biased at a constant voltage by the control signal 39, protects the PMOS transistor 45 by preventing a drain-to-source voltage (Vds) of the PMOS 45 from exceeding its safe operating limits.

A problem with CMOS devices is that they have large area requirements. In particular, the PMOS transistor of a CMOS device will occupy significant layout space on a chip or substrate due to nanowires. A possible replacement for the PMOS transistor could be a P drift transistor or a P extended drain metal-oxide-semiconductor (EDMOS) transistor, but these transistors are also voluminous and have large area requirements.

Figure 6:
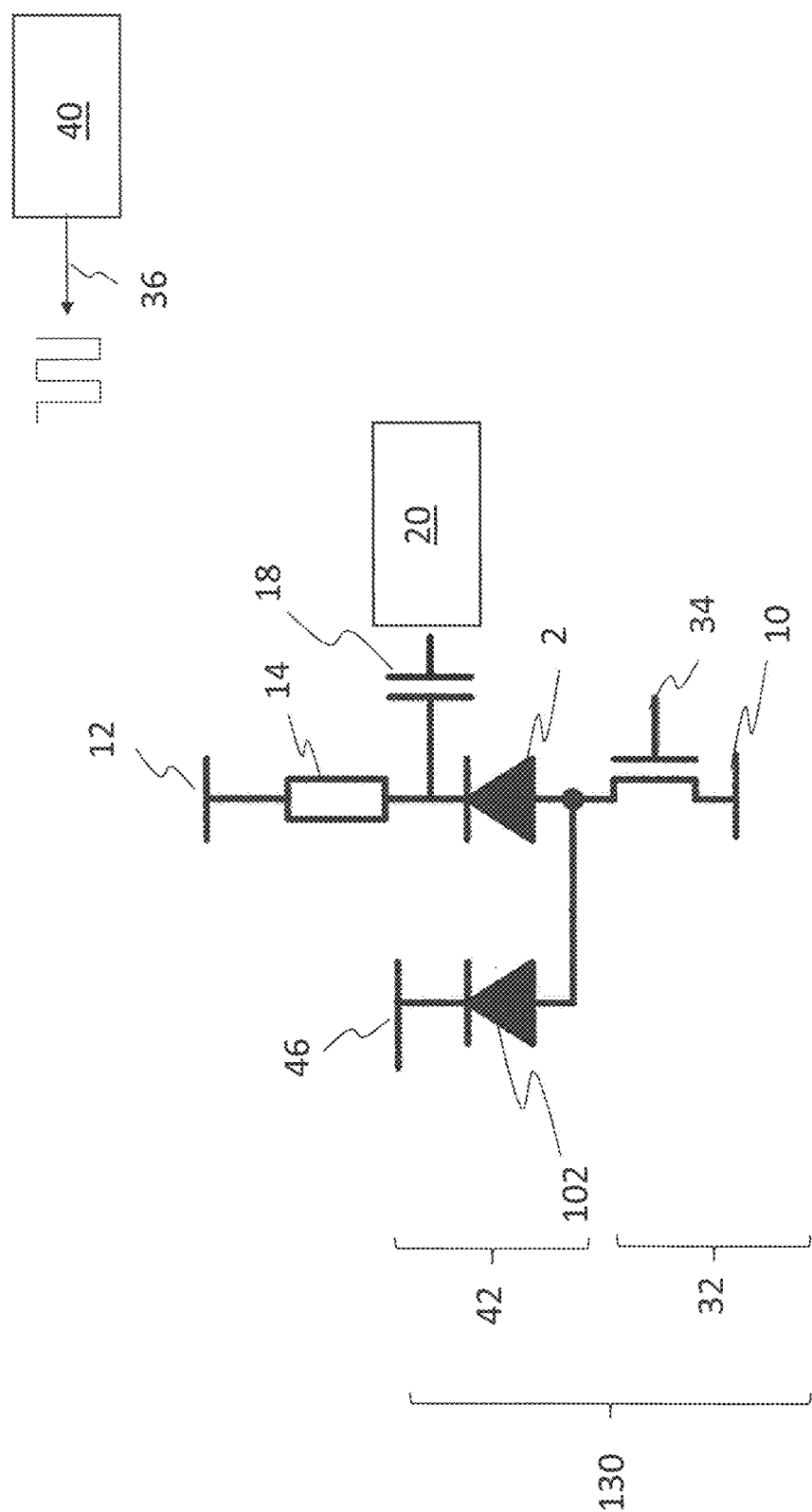
FIG. 6 shows a control circuit for controlling the avalanche diode of FIG. 1 according to a first embodiment.

FIG. 6 represents a control circuit 130 according to a first embodiment for controlling the avalanche diode 2 of FIG. 1. The control circuit 130 is similar to the control circuit 30 of FIG. 3 except that the PMOS transistor 44 is replaced by a clamp diode 102. The clamp diode 102 may be any diode, such as a small PN diode. The clamp diode 102 is less voluminous and has smaller area requirements than the PMOS transistor 44 and therefore the overall size of the control circuit 130 can be reduced. More specifically, the cathode of the clamp diode 102 is connected to the supply voltage 46. The anode of the clamp diode 102 is connected to the anode of the avalanche diode 2.

Figure 7:
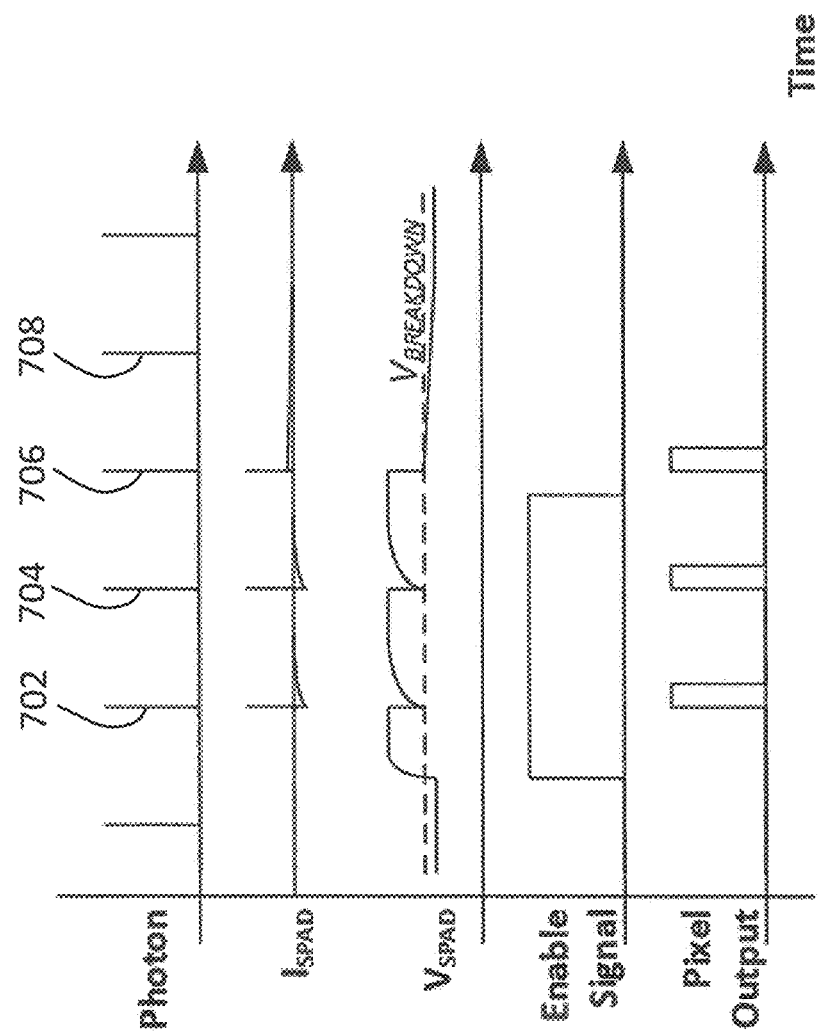
FIG. 7 shows a graph illustrating the behavior of the avalanche diode of FIG. 1a when controlled by the control circuit of FIG. 3.

FIG. 7 illustrates the behavior of the avalanche diode 2 of FIG. 1 when controlled by the control circuit 130 of FIG. 6.

When the control signal 36 (Enable Signal) switches to the high potential (i.e., high voltage level), the switch 34 connects the anode of the avalanche diode 2 to the supply voltage 10. In this way, the reverse bias voltage is set above the breakdown voltage. In addition, the clamp diode 102 is not conducting (i.e., the voltage between the cathode and the anode of the clamp diode 102 is below a threshold) and disconnects the anode of the avalanche diode 2 from the supply voltage 46.

When a first photon 702 is absorbed by the avalanche diode 2 an avalanche is generated. The reverse current ($I_{SPAD}$) flowing through the avalanche diode 2 (and through the switch 34) increases sharply during the avalanche (i.e., the recombination of electrons and holes in the depletion region increases sharply). The reverse current then becomes nil when the reverse bias voltage ($V_{SPAD}$) drops below the breakdown voltage. In contrast, the recharge current flowing through the resistor 14 is approximately nil during the avalanche. The recharge current increases sharply when the reverse bias voltage drops below the breakdown voltage. The recharge current exponentially decreases until being approximately nil when the reverse bias voltage is reset above the breakdown voltage. The detector 20 detects the sharp increase in the reverse current and generates an output (Pixel Output), such as a pulse. That is, after detecting the first photon the avalanche diode 2 is reset (i.e., quenched) by the resistor 14 to detect a second photon 704.

When the second photon 704 is absorbed, another avalanche is generated. Again, the reverse current flowing through the avalanche diode 2 increases sharply during the avalanche (i.e., the recombination of electrons and holes in the depletion region increases sharply). The reverse current then becomes nil when the reverse bias voltage drops below the breakdown voltage. In contrast, the recharge current flowing through the resistor 14 is approximately nil during the avalanche. The recharge current increases sharply when the reverse bias voltage drops below the breakdown voltage. The recharge current exponentially decreases until being approximately nil when the reverse bias voltage is reset above the breakdown voltage. The detector 20 detects the sharp increase in the reverse current and generates a corresponding output (e.g., a pulse). That is, after detecting the second photon the avalanche diode 2 is reset (i.e., quenched) by the resistor 14 to detect a third photon 706.

When the control signal 36 switches to its low potential, the switch 34 disconnects the anode of the avalanche diode 2 from the supply voltage 10. In this way, the reverse bias voltage is left floating above the breakdown voltage. In addition, the clamp diode 102 is non-conducting (i.e., the voltage between the cathode and the anode of the clamp diode 102 is below the threshold) and disconnects the anode of the avalanche diode 2 to the supply voltage 46.

When the third photon 706 is absorbed by the avalanche diode 2 an avalanche is generated. The reverse current flowing through the avalanche diode 2 increases sharply during the avalanche (i.e., the recombination of electrons and holes in the depletion region increases sharply). The reverse current then becomes nil when the reverse bias voltage drops below the breakdown voltage. In contrast, the recharge current flowing through the resistor 14 is approximately nil during the avalanche and remains approximately when the reverse bias voltage drops below the breakdown voltage. The detector 20 detects the sharp increase in the reverse current and generates a corresponding output (e.g., a pulse). That is, after detecting the third photon 706 the avalanche diode 2 is disabled and a fourth photon 708 cannot be detected.

It will be understood that as the reverse bias voltage decreases and reaches a voltage below the breakdown voltage, the clamp diode 102 starts conducting (i.e., the voltage between the cathode and the anode of the clamp diode 102 is above the threshold) and connects the anode of the avalanche diode 2 to the supply voltage 46. In this way, the anode of the avalanche diode 2 is maintained approximatively at the supply voltage 46 (i.e., supply voltage 46 minus the threshold) and the reverse bias voltage is maintained below the breakdown voltage.

When the fourth photon 708 is absorbed by the avalanche diode 2 no avalanche is generated because the reverse bias voltage is below the breakdown voltage. The reverse current flowing through the avalanche diode 2 is approximately nil. The recharge current flowing through the resistor 14 is approximately nil. The reverse bias voltage is below the breakdown voltage. The detector 20 does not detect any sharp increase in the reverse current and generates a corresponding output (e.g., no pulse).

Figure 8:
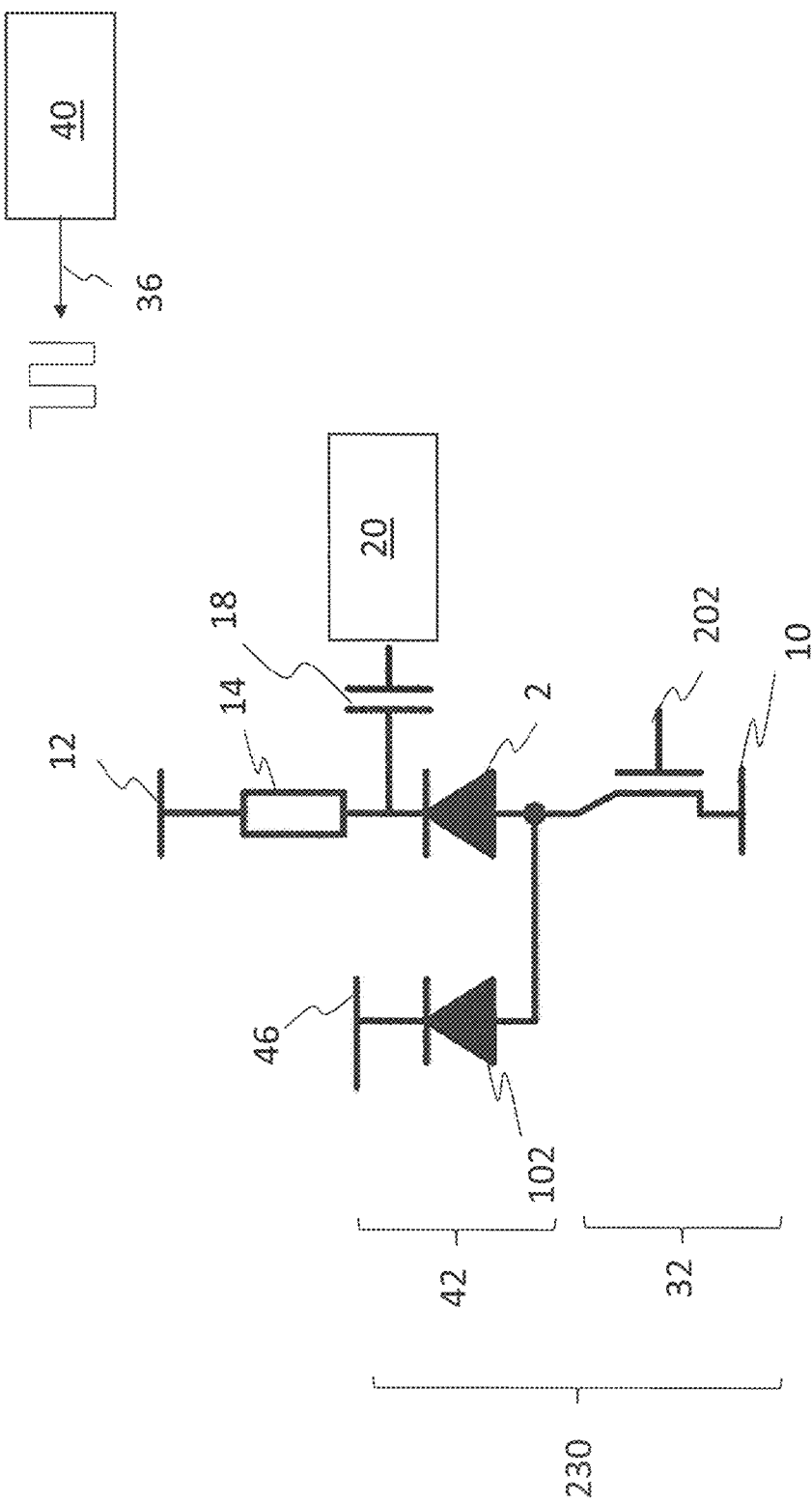
FIG. 8 shows a control circuit for controlling the avalanche diode of FIG. 1 according to a second embodiment.

FIG. 8 represents a control circuit 230 according to a second embodiment for controlling the avalanche diode 2 of FIG. 1. The control circuit 230 is similar to the control circuit 130 of FIG. 6 except that the NMOS transistor 34 is replaced by a high voltage NMOS transistor 202, such as an NEDMOS transistor. Using the high voltage NMOS transistor 202 allows the control circuit 230 to operate at higher voltage levels compared to the control circuit 130.

It will be understood that the behavior of the avalanche diode 2 of FIG. 1 when controlled by the control circuit 230 of FIG. 8 is the same as when controlled by the control circuit 130 of FIG. 6. Accordingly, this behavior of the avalanche diode 2 is not discussed in further details.

Figure 9:
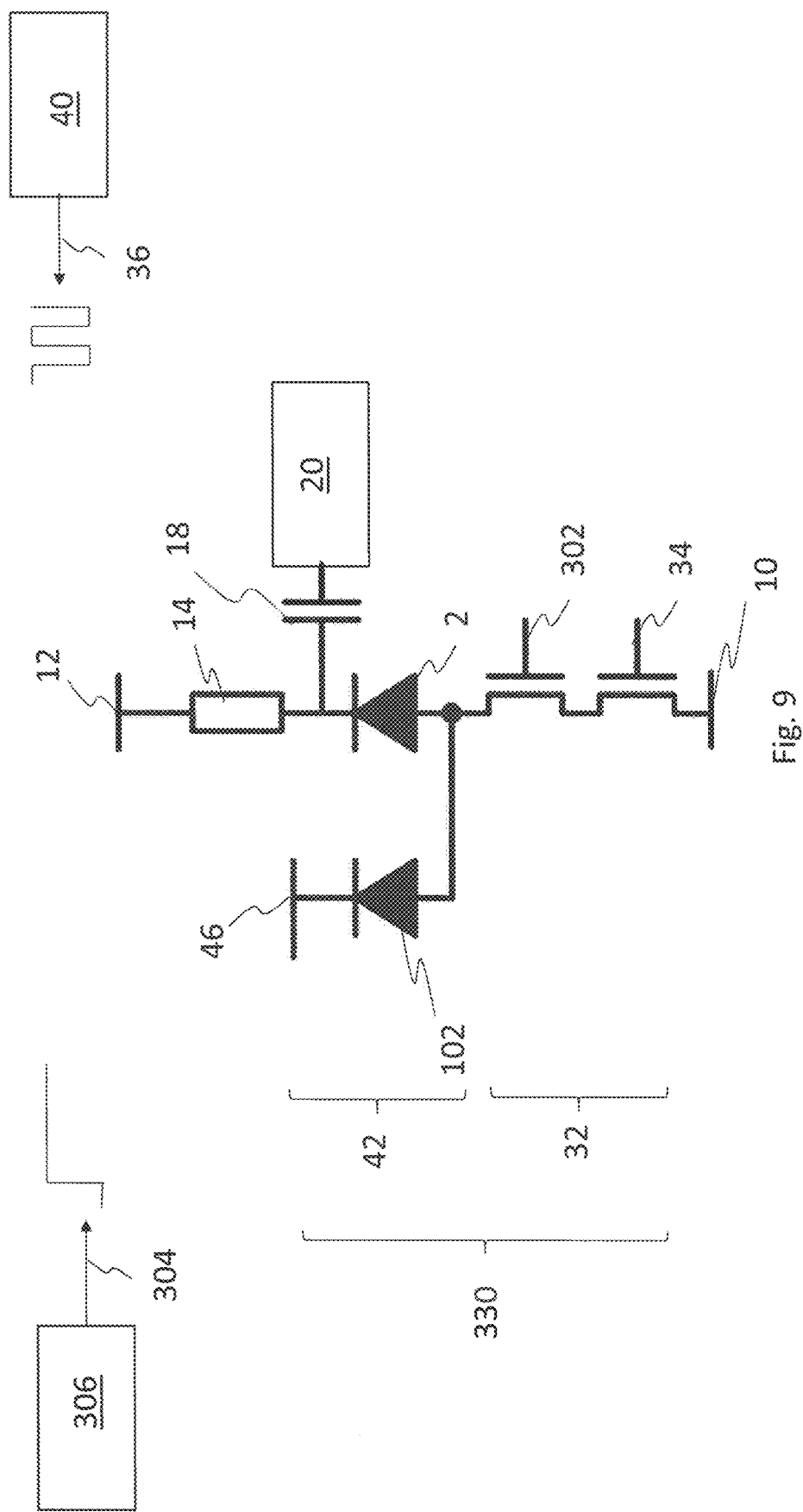
FIG. 9 shows a control circuit for controlling the avalanche diode of FIG. 1 according to a third embodiment.

FIG. 9 represents a control circuit 330 according to a third embodiment for controlling the avalanche diode 2 of FIG. 1 when reverse biased with a cathode moving node. The control circuit 330 is similar to the control circuit 130 of FIG. 6 except that the active pull down module 32 includes a cascade arrangement.

The cascade active pull down module 32 includes the NMOS transistor 34 and an NMOS transistor 302. More specifically, the drain of the NMOS transistor 34 is connected to the source of the NMOS transistor 302. The source of the NMOS transistor 34 is connected to the voltage supply 10. The drain of the NMOS transistor 302 is connected to the anode of the avalanche diode 2. The gate of the NMOS transistor 34 is arranged to receive the control signal 36. The gate of the NMOS transistor 302 is arranged to receive a control signal 304 generated by a control signal generator 306. In one embodiment, as shown in FIG. 9, the control signal 304 is fixed (i.e., not alternating). Stated differently, the control signal 304 is constant. In this way, the NMOS transistor 302 protects the NMOS transistor 34 from a potentially too high drain source voltage and becoming damaged.

It will be noted that alternatively the control signal 304 may be modulated (i.e., alternating) similar to the control signal 36 so that the NMOS transistor 302 may selectively connect the anode of the avalanche diode 2 to the supply voltage 10.

It will be understood that the behavior of the avalanche diode 2 of FIG. 1 when controlled by the control circuit 330 of FIG. 9 is the same as when controlled by the control circuit 130 of FIG. 6. Accordingly, this behavior of the avalanche diode 2 is not discussed in further details.

FIG. 10 represents a control circuit 430 according to a fourth embodiment for controlling the avalanche diode 2 of FIG. 1. The control circuit 430 is similar to the control circuit 330 of FIG. 9 except that the cascade arrangement is formed by the NMOS transistor 34 and a high voltage NMOS transistor, such as an NEDMOS transistor 402. Using the high voltage NMOS transistor 402 allows the control circuit 430 to operate at higher voltage levels compared to the control circuit 330.

More specifically, the drain of the NMOS transistor 34 is connected to the source of the NEDMOS transistor 402. The source of the MOS transistor 34 is connected to the voltage supply 10. The drain of the NMOS transistor 402 is connected to the anode of the avalanche diode 2. The gate of the NMOS transistor 34 is arranged to receive the control signal 36. The gate of the NMOS transistor 402 is arranged to receive a control signal 404 generated by a control signal generator 406. In one embodiment, as shown in FIG. 10, the control signal 404 is fixed (i.e., not alternating). In this way, the NEDMOS transistor 402 protects the NMOS transistor 34 from a potentially too high drain source voltage and becoming damaged.

It will be understood that the behavior of the avalanche diode 2 of FIG. 1 when controlled by the control circuit 430 of FIG. 10 is the same as when controlled by the control circuit 130 of FIG. 6. Accordingly, this behavior of the avalanche diode 2 is not discussed in further details.

Various embodiments with different variations have been described here above. It should be noted that those skilled in the art may combine various elements of these various embodiments and variations.

Such alterations, modifications, and improvements are intended to be part of this disclosure, and are intended to be within the scope of the claims. Accordingly, the foregoing description is by way of example and is not intended to be limiting.

In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A circuit, comprising:
an avalanche diode;
an active module configured to enable the avalanche diode and apply a first reverse bias voltage to the avalanche diode, the first reverse bias voltage being equal to or greater than a breakdown voltage of the avalanche diode, the active module including a first control signal generator configured to generate a first control signal and, a first switch configured to be controlled by the first control signal to connect and disconnect the avalanche diode to a first voltage input; and
a passive module configured to disable the avalanche diode and apply a second reverse bias voltage to the avalanche diode, the second reverse bias voltage being less than the breakdown voltage, the passive module including a clamp diode coupled to a second voltage input, the first switch, and the avalanche diode.

2. The circuit of claim 1 wherein the clamp diode includes a cathode coupled to the second voltage input and an anode coupled to an anode of the avalanche diode.

3. The circuit of claim 1 wherein the first switch is a metal-oxide-semiconductor (MOS) switch.

4. The circuit of claim 1 wherein the first switch is an N type metal-oxide-semiconductor (NMOS) switch.

5. The circuit of claim 1 wherein the first switch is an N type extended drain metal-oxide-semiconductor (NEDMOS) switch.

6. The circuit of claim 1 wherein the active module includes a second control signal generator configured to generate a second control signal, and a second switch configured to be controlled by the second control signal to connect and disconnect avalanche diode to the first voltage input.

7. The circuit of claim 6 wherein the second switch is a metal-oxide-semiconductor (MOS) switch.

8. The circuit of claim 6 wherein the second switch is an N type metal-oxide-semiconductor (NMOS) switch.

9. The circuit of claim 6 wherein the second switch is an N type extended drain metal-oxide-semiconductor (NEDMOS) switch.

10. A system, comprising:
an avalanche diode; and
a control circuit configured to control the avalanche diode, the control circuit including:
a first switch coupled between an anode of the avalanche diode and a first voltage supply;
a clamp diode coupled between the anode of the avalanche diode and a second voltage supply; and
a resistor coupled between a cathode of the avalanche diode and a third voltage supply.

11. The system of claim 10 wherein the control circuit further includes a detector coupled to the cathode of the avalanche diode, and the detector is configured to detect an increase in an electrical current.

12. The system of claim 11 wherein the control circuit further includes a capacitor coupled between the detector and the cathode of the avalanche diode.

13. The system of claim 10 wherein the control circuit further includes a second switch coupled between the anode of the avalanche diode and the first switch.

14. The system of claim 13, further comprising:
a first control signal generator configured to generate a first control signal to open and close the first switch; and
a second control signal generator configured to generate a second control signal to open and close the second switch.

15. The system of claim 14 wherein the first control signal alternates between first and second voltage levels, and the second control signal is constant.

16. A method, comprising:
generating a control signal that alternates between a first voltage level and a second voltage level;
applying the control signal to a control circuit for an avalanche diode, the control circuit including a first switch coupled between the avalanche diode and a first voltage supply, a clamp diode coupled between the avalanche diode and a second voltage supply, and a resistor coupled between the avalanche diode and a third voltage supply;
closing the first switch when the control signal has the first voltage level; and
opening the first switch when the control signal has the second voltage level.

17. The method of claim 16, further comprising:
receiving, by the avalanche diode, a photon; and
detecting an electrical current though the avalanche diode in response to the photon being received by the avalanche diode.

18. The method of claim 16, further comprising:
applying a first reverse bias voltage to the avalanche diode when the control signal has the first voltage level, the first reverse bias voltage being greater than a breakdown voltage of the avalanche diode; and
applying a second reverse bias voltage to the avalanche diode when the control signal has the second voltage level, the second reverse bias voltage being less than the breakdown voltage of the avalanche diode.

19. The circuit of claim 1 wherein the first switch and an anode of the clamp diode are coupled to an anode of the avalanche diode, and a cathode of the clamp diode is coupled to the second voltage input.

20. The circuit of claim 1, further comprising:
a resistor coupled to a cathode of the avalanche diode and a third voltage input, an anode of the avalanche diode being coupled to the first switch and an anode of the clamp diode.

21. A circuit, comprising:
an avalanche diode;
an active module configured to enable the avalanche diode and apply a first reverse bias voltage to the avalanche diode, the first reverse bias voltage being equal to or greater than a breakdown voltage of the avalanche diode, the active module including:
a first control signal generator configured to generate a first control signal,
a first switch configured to be controlled by the first control signal to connect and disconnect the avalanche diode to a voltage supply,
a second control signal generator configured to generate a second control signal, and
a second switch configured to be controlled by the second control signal to connect and disconnect avalanche diode to the voltage supply; and
a passive module configured to disable the avalanche diode and apply a second reverse bias voltage to the avalanche diode, the second reverse bias voltage being less than the breakdown voltage.

22. The circuit of claim 21 wherein the second switch is a metal-oxide-semiconductor (MOS) switch.

23. The circuit of claim 21 wherein the second switch is an N type metal-oxide-semiconductor (NMOS) switch.

24. The circuit of claim 21 wherein the second switch is an N type extended drain metal-oxide-semiconductor (NEDMOS) switch.

* * * * *